United States Patent
Zhuang et al.

(10) Patent No.: US 9,523,035 B2
(45) Date of Patent: Dec. 20, 2016

(54) SILICON-CONTAINING PHOSPHOR FOR LED, ITS PREPARATION AND THE LIGHT EMITTING DEVICES USING THE SAME

(75) Inventors: Weidong Zhuang, Beijing (CN); Yunsheng Hu, Beijing (CN); Ying Fang, Beijing (CN); Xiaowei Huang, Beijing (CN); Huaqiang He, Beijing (CN)

(73) Assignee: GRIREM ADVANCED MATERIALS CO., LTD., Beijing (CN)

( * ) Notice: Subject to any disclaimer, the term of this patent is extended or adjusted under 35 U.S.C. 154(b) by 856 days.

(21) Appl. No.: 12/359,693

(22) Filed: Jan. 26, 2009

(65) Prior Publication Data

US 2009/0128006 A1    May 21, 2009

Related U.S. Application Data

(63) Continuation of application No. PCT/CN2007/002201, filed on Jul. 19, 2007.

(30) Foreign Application Priority Data

Jul. 26, 2006   (CN) .......................... 2006 1 0088926

(51) Int. Cl.
    *C09K 11/77*    (2006.01)
    *H01L 33/50*    (2010.01)
(52) U.S. Cl.
    CPC .......... *C09K 11/7792* (2013.01); *H01L 33/502* (2013.01); *Y02B 20/181* (2013.01)
(58) Field of Classification Search
    CPC ............. C09K 11/7792; C09K 11/7734; C09K 11/7791
    USPC ..................................... 252/301.4 F, 301.4 H
    See application file for complete search history.

(56) References Cited

U.S. PATENT DOCUMENTS 5,140,163 A * 8/1992 Tecotzky et al. .......... 250/484.4
5,839,718 A * 11/1998 Hase et al. ............. 252/301.4 F
(Continued)

FOREIGN PATENT DOCUMENTS

CN    1524926    9/2004
CN    1788069    6/2006
(Continued)

OTHER PUBLICATIONS

Lall. Nature of Traps in mixed Ba—Sr orthosilicate phosphors. Electrical and Optical Behaviour of solids 1st Edition. Nath. Mittal Publications Delhi India 1989.*
(Continued)

*Primary Examiner* — Matthew E Hoban

(57) ABSTRACT

A silicon-containing phosphor for LED and its preparation method, and the devices incorporating the same. The phosphor in the present invention can be represented as $AO \cdot aSiO_2 \cdot bAX_2:mEu^{2+},nR^{3+}$, wherein A is at least one metal element selected from a group consisting of Sr, Ba, Ca, Mg, and Zn; X is at least one halogen element selected from a group consisting of F, Cl, Br, and I; R is at least one element selected from a group consisting of Bi, Y, La, Ce, Pr, Gd, Tb, and Dy; $0.1<a<2$, $0.005<b<0.08$, $0.005<m<0.5$, $0.005<n<0.5$, and $m+n<1$. The phosphor has excellent luminescent performance and good stability, wide excitation band, and adjustable emission wavelength. White or color LED can be obtained by combining the phosphor of the present invention with UV, purple or blue light LED chip.

14 Claims, 1 Drawing Sheet

(56) References Cited

U.S. PATENT DOCUMENTS

| | | | |
|---|---|---|---|
| 7,468,147 B2* | 12/2008 | Shida et al. | 252/301.4 F |
| 7,575,697 B2* | 8/2009 | Li et al. | 252/301.4 F |
| 7,601,276 B2* | 10/2009 | Li et al. | 252/301.4 F |
| 7,648,650 B2* | 1/2010 | Liu | H05B 33/14 |
| | | | 252/301.4 F |
| 2004/0227465 A1* | 11/2004 | Menkara et al. | 313/585 |
| 2006/0027785 A1* | 2/2006 | Wang et al. | 252/301.4 F |

FOREIGN PATENT DOCUMENTS

| | | |
|---|---|---|
| DE | 20108013 | 8/2001 |
| DE | 69628201 | 3/2004 |
| EP | 0304121 | 2/1989 |
| KR | 10-2006-0012000 | 2/2006 |
| WO | 2004/111156 | 12/2004 |

OTHER PUBLICATIONS

Yang. The luminescence characteristics of europium activated strontium silicate synthesized at high temperature and high pressure. Journal of Materials Science Letters 15 (1996) 1891 1894.*
Korean Office Action dated Jan. 20, 2011 in corresponding Korean Patent Application No. 10-2009-7003857.
Korean Notice of Allowance dated Sep. 26, 2011 in corresponding Korean Patent Application No. 10-2009-7003857.
German Office Action dated Jan. 13, 2014 in corresponding German Patent Application No. 112007001712.0.

* cited by examiner

SILICON-CONTAINING PHOSPHOR FOR LED, ITS PREPARATION AND THE LIGHT EMITTING DEVICES USING THE SAME

CROSS REFERENCE TO RELATED APPLICATIONS

This application is a continuation application filed under 35 U.S.C. §111(a), claiming the benefit under 35 U.S.C. §120 and §365(c) of a PCT International Application Number PCT/CN2007/002201, filed Jul. 19, 2007, it being further noted that foreign priority benefit is based upon Chinese Patent Application 2006/0088926.6, filed Jul. 26, 2006 in the State Intellectual Property Office of P.R. China, the disclosures of which are thereby incorporated by reference.

FIELDS OF THE INVENTION

The present invention relates to silicon containing phosphor for light emitting diodes, ("LEDs") and its preparation methods, this phosphor can be excited by ultraviolet, purple or blue light; and more particularly, this invention also relates to the light emitting devices incorporating this phosphor.

BACKGROUND OF THE INVENTION

LED is an efficient, low-cost and green solid state light emitting device, and it also has the advantages of safety, fast-response, stable performance, small volume, resistance to vibrancy and impact, long life, etc. Nowadays, LED has been used widely in the field of indicating lamp, signal lamp, mobile phone, etc. LED will likely go into the general lighting field to substitute for incandescence lamp and fluorescent lamp.

The simplest way to achieve white light is to combine LED chip with phosphor basing on color match principle (also called as "pc-LED", or phosphor-converted LED). Full color display can be fulfilled by UV, purple or blue light chip coated with phosphor. There are three ways to obtain white pc-LED: first, coating yellow phosphor on blue LED chip; second, combining blue LED chip with green and red phosphors; and third, blending tri-color phosphors and UV or purple LED chip. On the other hand, green LED can be obtained by coating green phosphors on UV-LED. The efficiency of this phosphor-converted green LED is much higher than that of single InGaN green chip. Likewise, coating yellow phosphor on UV-LED can produce yellow LED, and etc. In a word, various colorful LED can be obtained by combining some excellent phosphors with UV, purple or blue light LED according to color match principle.

At present, the popular way to achieve white LED is coating yellow phosphor $(Re_{1-r}Sm_r)_3(Al_{1-s}Ga_s)_5O_{12}$:Ce (YAG:Ce, U.S. Pat. No. 5,998,925) (YAG is "yttrium aluminum garnet") or $(Tb_{1-x-y}Re_xCe_y)_3(Al,Ga)_5O_{12}$ (TAG:Ce, U.S. Pat. No. 6,669,866) on InGaN blue chip. Both YAG:Ce and TAG:Ce present wide band emission when they are excited by blue light. But the luminescent efficiency needs further improvement. In addition, their emission peak can only be adjusted between 520 nm and 560 nm; this can not satisfy the requirements of LED with low relative color temperature and high color rendering index.

In U.S. Pat. No. 6,429,583, LED lamp was manufactured by combining blue LED chip with $Ba_2SiO_4$:$Eu^{2+}$ phosphors. This phosphor emits green light with wavelength centered at 505 nm. However, because of the scarcity of red light, it is hard to achieve white light with high color rendering index.

U.S. Pat. No. 6,809,347 mentioned a kind of LED coated with $Eu^{2+}$-doped silicate phosphor $(2-x-y)SrO.x(Ba_u,Ca_v)O.(1-a-b-c-d)SiO_2.aP_2O_5.bAl_2O_3.cB_2O_3.dGeO_2$:$yEu^{2+}$ or $(2-x-y)BaO.x(Sr_u,Ca_v)O.(1-a-b-c-d)SiO_2.aP_2O_5.bAl_2O_3.cB_2O_3.dGeO_2$:$yEu^{2+}$. It can be excited by UV or blue LED, and the emission can also be modified from olivine to yellow even to orange light by adjusting the variable of phosphor composition. In the case, white LED with low relative color temperature and high color rendering index can be achieved.

Additionally, U.S. Patent Application Publications 2006/0027781 and 2006/0028122 referred to $A_2SiO_4$:Eu,D phosphor, wherein A is at least one metal element selected from a group consisting of Ca, Sr, Ba, Mg, Zn, and Cd, and D as compensating agent, is at least one nonmetal element selected from a group consisting of halogen or P, S, N. Through adjusting the species or ratio of A, this phosphor can achieve 460-590 nm emission when excited by 280-490 nm light. Moreover, the introduction of D affects not only luminescent intensity but also emission peak. The effects are much obvious when D is F according to these documents.

Accordingly, due to its wider emission band, $Eu^{2+}$ doped silicate phosphor is more applicable for LED with low color temperature, when compared with YAG:Ce (TAG:Ce). However, above silicate phosphors are just doped with single rare earth ion, and their luminescent intensity needs to be improved for its LED application. The inventors have found out that the luminescent intensity of silicate phosphor can be further improved by doping more rare earth ions.

The present invention improves the luminescent efficiency of silicate phosphor by double-doped and multi-doped activator ions. Furthermore, by adjusting the composition of matrix, the present silicon containing phosphor can combine well with different LED chip to make white or color light emitting devices.

SUMMARY OF THE INVENTION

One aspect of the present invention is to provide a kind of double-doped or multi-doped LED phosphor, this phosphor contains Si element, and can be excited by UV, purple or blue LED chip.

Another aspect of the present invention is to provide a simple, non-pollution and low-cost method to produce the phosphor of the present invention.

Still another aspect of the present invention is to provide, for example, a white or color light emitting device which is incorporated with the phosphor of the present invention.

As one embodiment, a silicon-containing phosphor for LED can be represented by the general formula:

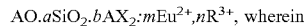

$AO.aSiO_2.bAX_2$:$mEu^{2+},nR^{3+}$, wherein

A is at least one metal element selected from a group consisting of Sr, Ba, Ca, Mg, and Zn;

X is at least one halogen element selected from a group consisting of F, Cl, Br, and I;

R is at least one element selected from a group consisting of Bi, Y, La, Ce, Pr, Gd, Tb, and Dy;

0.1<a<2, 0.005<b<0.08, 0.005<m<0.5, 0.005<n<0.5, and m+n<1.

A preparation method necessary to producing the phosphor according to above-described general formula includes the following:

(1) Selecting the raw materials from the corresponding elementary substance, oxide, halide or other compound of the compositional elements, and weighing the raw materials according to the appropriate stoichiometric ratio;

(2) Mixing and grinding the raw materials homogeneously to form a mixture;

(3) Baking the mixture at high temperature in reducing atmosphere to form a baked product; and (4) Carrying out a post-treatment to the baked product to obtain the silicon-containing phosphor for.

According to (3) above, the baking in reducing atmosphere can be operated once or more.

According to (3) above, a strong reducing atmosphere is required.

According to (3) above, the temperature of each baking is during 1100-1500° C.

According to (3) above, each baking process should last for 0.5~20 h.

According to (4) above, the post-treatment is conventional, that is the processes of grinding, washing the baked product for 3~20 times with deionized water, filtering and drying.

According to (4) above, the temperature of drying is 80~160° C.

The phosphor of the present invention has excellent luminescent performance. Its emission peak can be adjusted from green to orange light, and this is determined by the composition of A and the co-doped ion $R^{3+}$ in the matrix. The phosphor has wide efficient excitation range from 200 to 500 nm. So it is suitable for UV, purple or blue LED chip, and can be used to produce white and color LED.

In accordance with an aspect of the invention, suitable applications of the phosphor include the following:

(1) Combining the phosphor with blue LED chip to obtain white LED;

(2) Coating the phosphor with other suitable red phosphor on blue LED chip to obtain white LED;

(3) Coating the phosphor with other suitable red phosphor and blue phosphor on UV or purple LED chip to obtain white LED;

(4) Combining the phosphor with UV or purple LED chip to obtain green, yellow or orange LED; and (5) Combining the phosphor with other LED chip to obtain white or color LED.

Another aspect of the present invention is related to a light emitting device comprising:

at least one of UV, purple and blue light LED chip, and the silicon-containing phosphor for LED that can be represented by the general formula of AO.$a$SiO$_2$.$b$AX$_2$:$m$Eu$^{2+}$,$n$R$^{3+}$; wherein A is at least one metal element selected from a group consisting of Sr, Ba, Ca, Mg, and Zn;

X is at least one halogen element selected from a group consisting of F, Cl, Br, and I;

R is at least one element selected from a group consisting of Bi, Y, La, Ce, Pr, Gd, Tb, and Dy;

0.1<a<2,
0.005<b<0.08,
0.005<m<0.5,
0.005<n<0.5, and
m+n<1.

The above-described light emitting device may further comprise at least one additional phosphor selected from other types.

The emitting color of the above-described light emitting device can be green, yellow, orange or white.

An additional aspect of the present invention is related to a display using the above light emitting device as a light source.

Still another aspect of the present invention is related to a lighting system using the above-described light emitting device as a light source.

The above-described phosphor of the present invention is stable.

The excitation spectrum of the phosphor of the present invention is wide, that is to say, the phosphor can be efficiently excited by the light in the range of 200-500 nm, preferably by 300~480 nm. So it is very suitable for UV, purple or blue LED chip (shown in FIG. 1).

By double-doped or multi-doped methods, the present phosphor has high emission intensity when excited by LED, which is helpful for the efficiency of the LED product.

The method for producing the phosphor in the present invention is simple and is convenient for mass production.

This invention presents a simple way to achieve high efficient white lighting or full-color display based on the common LED chip and the silicon-containing phosphor of the present invention.

DETAILED DESCRIPTION OF THE EXAMPLES

Comparative Example

Production of (Sr,Ba)$_2$SiO$_4$:Eu$^{2+}$ Phosphor

BaCO$_3$ 0.163 g, SrCO$_3$ 11.68 g, SiO$_2$.2.72 g and Eu$_2$O$_3$ 0.435 g are weighed according to the formula of the title phosphor, ground and mixed, and baked at 1350° C. for 6 hours in H$_2$ atmosphere. After that, the baked product was washed with deionized water for 3 times, filtered, dried at 120° C., and then (Sr,Ba)$_2$SiO$_4$:Eu$^{2+}$ phosphor is obtained. The emission intensity is listed in Table 1.

Example 1

Figure 1:
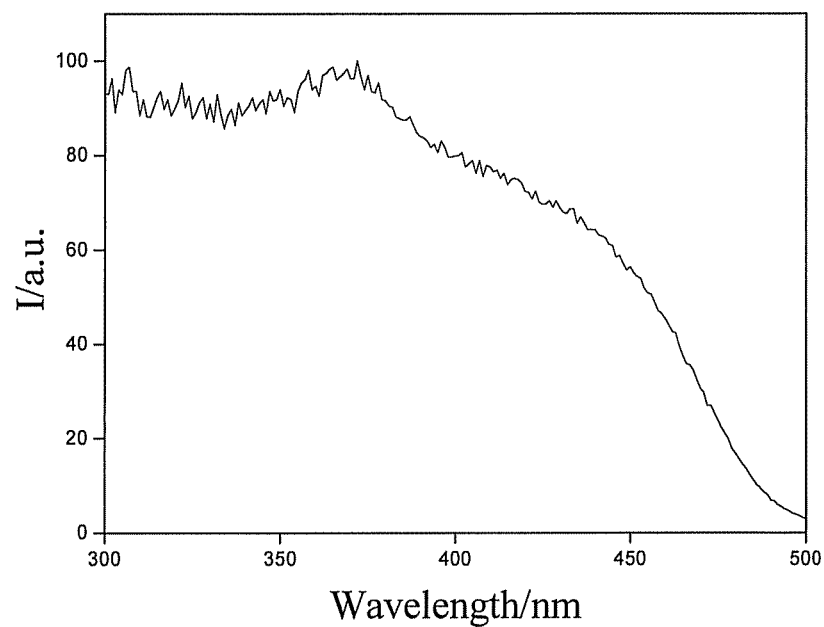
FIG. 1 shows the excitation spectrum of the (Sr$_{0.98}$Ba$_{0.02}$)O.0.5SiO$_2$.0.01MgF$_2$:0.03Eu$^{2+}$, 0.03Y$^{3+}$ phosphor (Example 1).
Figure 2:
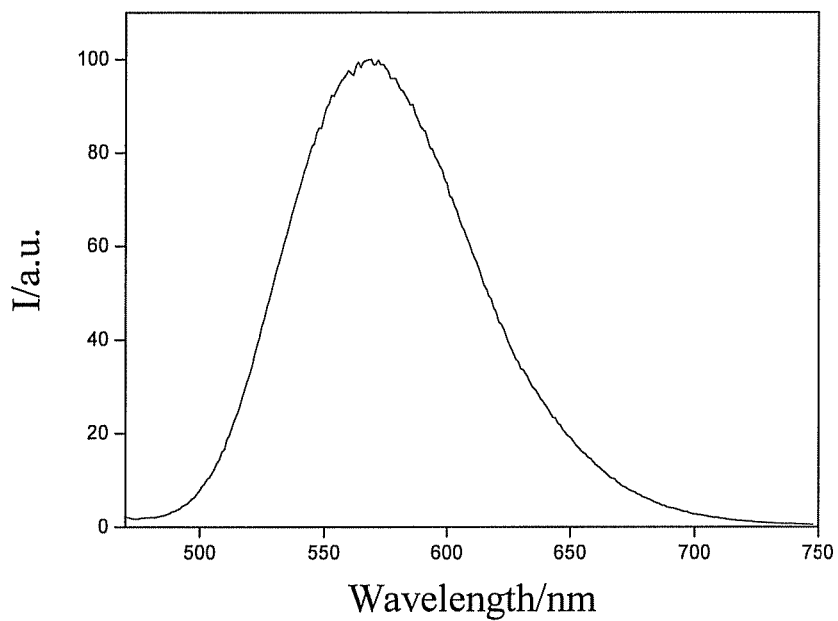
FIG. 2 shows the emission spectrum of the (Sr$_{0.98}$Ba$_{0.02}$)O.0.5SiO$_2$.0.01MgF$_2$:0.03Eu$^{2+}$, 0.03Y$^{3+}$ phosphor (Example 1).

Production of (Sr$_{0.93}$Ba$_{0.02}$)O.0.5SiO$_2$.0.01MgF$_2$:
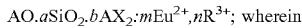
0.03Eu$^{2+}$, 0.03Y$^{3+}$ phosphor BaCO$_3$ 0.315 g, SrCO$_3$ 11.546, SiO$_2$.2.398 g, Eu$_2$O$_3$ 0.421 g, MgF$_2$ 0.05 g, Y$_2$O$_3$ 0.27 g are weighed according to the formula of the title phosphor. The preparation is the same as the Comparative Example. (Sr$_{0.98}$Ba$_{0.02}$)O.0.5SiO$_2$.0.01MgF$_2$:0.03Eu$^{2+}$, 0.03Y$^{3+}$ phosphor is obtained. The excitation and emission spectra are showed in FIG. 1 and FIG. 2, respectively. It can be seen that, the excitation spectrum of the phosphor is broad and the phosphor can be efficiently excited by the light in the range of 300~470 nm. So it is very suitable for UV, purple or blue LED chip. The emission band is peaked at 570 nm. Its emission intensity is listed in Table 1, and it can be seen that, due to the doping of Y, the emission intensity is much higher than that of the sample in the comparing embodiment.

Example 2

Production of $(Sr_{0.98}Ca_{0.02})O\cdot 0.5SiO_2\cdot 0.015BaF_2: 0.04Eu^{2+}, 0.04Y^{3+}, 0.02La^{3+}$ phosphor $CaCO_3$ 0.155 g, $SrCO_3$ 11.177 g, $SiO_2$ 2.321 g, $Eu_2O_3$ 0.544 g, $BaF_2$ 0.203 g, $Y_2O_3$ 0.349 g, $La_2O_3$ 0.252 g are weighed according to the formula of the title phosphor. The preparation is same as the comparative Example. $(Sr_{0.98}Ca_{0.02})O\cdot 0.5SiO_2\cdot 0.015BaF_2: 0.04Eu^{2+}, 0.04Y^{3+}, 0.02La^{3+}$ phosphor is obtained. Its luminescent intensity and emission peak are showed in Table 1.

Example 3 to Example 50

Raw materials of each embodiments are weighted according to the compositional formula in Table 1 respectively. And the other produce processes are the same as Embodiment 1. The obtained emission peak and relative luminescent intensity are show in Table 1.

TABLE 1

| Example | Composition Formula | Emission peak/nm | Relative intensity |
|---|---|---|---|
| Comparative Example | $(Sr,Ba)_2SiO_4:Eu^{2+}$ | 570 | 100 |
| 1 | $(Sr_{0.98}Ba_{0.02})O\cdot 0.5SiO_2\cdot 0.01MgF_2: 0.03Eu^{2+}, 0.03Y^{3+}$ | 570 | 175 |
| 2 | $(Sr_{0.98}Ca_{0.02})O\cdot 0.5SiO_2\cdot 0.015BaF_2: 0.04Eu^{2+}, 0.04Y^{3+}, 0.02La^{3+}$ | 572 | 180 |
| 3 | $(Sr_{0.8}Ba_{0.2})O\cdot 0.5SiO_2\cdot 0.01SrF_2: 0.05Eu^{2+}, 0.02Y^{3+}$ | 550 | 196 |
| 4 | $(Sr_{0.8}Ba_{0.2})O\cdot 0.5SiO_2\cdot 0.045BaF_2: 0.06Eu^{2+}, 0.02Y^{3+}$ | 550 | 184 |
| 5 | $(Sr_{0.8}Ba_{0.2})O\cdot 0.5SiO_2\cdot 0.009CaF_2: 0.08Eu^{2+}, 0.02Y^{3+}$ | 550 | 122 |
| 6 | $(Sr_{0.8}Ba_{0.2})O\cdot 0.5SiO_2\cdot 0.05MgF_2: 0.3Eu^{2+}, 0.06Y^{3+}$ | 550 | 145 |
| 7 | $(Sr_{0.8}Ba_{0.2})O\cdot 0.5SiO_2\cdot 0.06SrF_2: 0.06Eu^{2+}, 0.1Y^{3+}$ | 550 | 130 |
| 8 | $(Sr_{0.8}Ba_{0.2})O\cdot 0.5SiO_2\cdot 0.06BaF_2: 0.2Eu^{2+}, 0.2Y^{3+}$ | 553 | 178 |
| 9 | $(Sr_{0.8}Ba_{0.2})O\cdot 0.5SiO_2\cdot 0.045SrF_2: 0.008Eu^{2+}, 0.006Y^{3+}$ | 557 | 121 |
| 10 | $(Sr_{0.8}Ba_{0.2})O\cdot 0.5SiO_2\cdot 0.05SrCl_2: 0.06Eu^{2+}, 0.06Y^{3+}$ | 550 | 133 |
| 11 | $(Sr_{0.8}Ba_{0.2})O\cdot 0.5SiO_2\cdot 0.03SrBr_2: 0.04Eu^{2+} 0.06Y^{3+}$ | 550 | 146 |
| 12 | $(Sr_{0.8}Ba_{0.2})O\cdot 0.5SiO_2\cdot 0.045SrI_2: 0.09Eu^{2+}, 0.06Y^{3+}$ | 550 | 156 |
| 13 | $(Sr_{0.55}Ba_{0.45})O\cdot 0.5SiO_2\cdot 0.01SrF_2: 0.1Eu^{2+}, 0.06Y^{3+}$ | 521 | 178 |
| 14 | $BaO\cdot 0.5SiO_2\cdot 0.045BaF_2:0.2Eu^{2+} 0.06Y^{3+}$ | 505 | 217 |
| 15 | $(Sr_{0.3}Ba_{0.7})O\cdot 0.2SiO_2\cdot 0.045ZnCl_2: 0.06Eu^{2+}, 0.06Y^{3+}$ | 516 | 217 |
| 16 | $(Sr_{0.4}Ba_{0.6})O\cdot 0.8SiO_2\cdot 0.045MgBr_2: 0.05Eu^{2+}, 0.06Y^{3+}$ | 533 | 208 |
| 17 | $(Sr_{0.4}Ba_{0.6})O\cdot 1.9SiO_2\cdot 0.018CaI_2: 0.06Eu^{2+}, 0.06Y^{3+}$ | 537 | 198 |
| 18 | $(Sr_{0.5}Ba_{0.5})O\cdot 1.7SiO_2\cdot 0.008MgF_2: 0.03Eu^{2+}, 0.06Y^{3+}$ | 543 | 189 |
| 19 | $(Sr_{0.45}Ba_{0.45}Mg_{0.1})O\cdot 0.5SiO_2\cdot 0.034BaF_2: 0.12Eu^{2+}, 0.06Y^{3+}$ | 592 | 197 |
| 20 | $(Sr_{0.45}Ba_{0.45}Zn_{0.1})O\cdot 0.5SiO_2\cdot 0.07SrF_2: 0.15Eu^{2+}, 0.06Y^{3+}$ | 596 | 201 |
| 21 | $(Sr_{0.45}Ba_{0.45}Zn_{0.1})O\cdot 0.5SiO_2\cdot 0.06SrCl_2: 0.22Eu^{2+}, 0.06Y^{3+}$ | 596 | 194 |
| 22 | $(Sr_{0.98}Ba_{0.02})O\cdot 0.5SiO_2\cdot 0.04SrF_2: 0.06Eu^{2+}, 0.06Bi^{3+}$ | 570 | 157 |
| 23 | $(Sr_{0.98}Ba_{0.02})O\cdot 0.5SiO_2\cdot 0.045MgCl_2: 0.35Eu^{2+}, 0.06La^{3+}$ | 570 | 148 |
| 24 | $(Sr_{0.98}Ba_{0.02})O\cdot 0.5SiO_2\cdot 0.063SrBr_2: 0.45Eu^{2+}, 0.06Ce^{3+}$ | 570 | 130 |
| 25 | $(Sr_{0.98}Ba_{0.02})O\cdot 0.5SiO_2\cdot 0.032SrI_2: 0.01Eu^{2+}, 0.009Pr^{3+}$ | 570 | 128 |
| 26 | $(Sr_{0.98}Ba_{0.02})O\cdot 0.5SiO_2\cdot 0.015BaF_2: 0.006 Eu^{2+}, 0.006Gd^{3+}$ | 570 | 121 |
| 27 | $(Sr_{0.98}Ba_{0.02})O\cdot 0.5SiO_2\cdot 0.05MgF_2: 0.07Eu^{2+}, 0.06Tb^{3+}$ | 570 | 123 |
| 28 | $(Sr_{0.98}Ba_{0.02})O\cdot 0.5SiO_2\cdot 0.03SrF_2: 0.0075Eu^{2+}, 0.0065Dy^{3+}$ | 570 | 143 |
| 29 | $(Sr_{0.6}Ba_{0.04})O\cdot 0.5SiO_2\cdot 0.01SrF_2: 0.06Eu^{2+}, 0.06Bi^{3+}$ | 550 | 152 |
| 30 | $(Sr_{0.75}Ba_{0.25})O\cdot 0.5SiO_2\cdot 0.045MgF_2: 0.06Eu^{2+}, 0.06Y^{3+}$ | 560 | 172 |
| 31 | $(Sr_{0.6}Ba_{0.4})O\cdot 0.5SiO_2\cdot 0.01BaF_2: 0.06Eu^{2+}, 0.06La^{3+}$ | 550 | 143 |

TABLE 1-continued

| Example | Composition Formula | Emission peak/nm | Relative intensity |
|---|---|---|---|
| 32 | $(Sr_{0.6}Ba_{0.4})O \cdot 0.5SiO_2 \cdot 0.025SrF_2$: $0.06Eu^{2+}, 0.03Ce^{3+}$ | 550 | 151 |
| 33 | $(Sr_{0.6}Ba_{0.4})O \cdot 0.5SiO_2 \cdot 0.051CaF_2$: $0.09Eu^{2+}, 0.03Pr^{3+}$ | 550 | 157 |
| 34 | $(Sr_{0.6}Ba_{0.4})O \cdot 0.5SiO_2 \cdot 0.026MgF_2$: $0.1Eu^{2+}, 0.03Gd^{3+}$ | 550 | 121 |
| 35 | $(Sr_{0.6}Ba_{0.4})O \cdot 0.5SiO_2 \cdot 0.036BaCl_2$: $0.012Eu^{2+}, 0.007Tb^{3+}$ | 550 | 129 |
| 36 | $(Sr_{0.6}Ba_{0.4})O \cdot 0.5SiO_2 \cdot 0.052ZnF_2$: $0.2Eu^{2+}, 0.03Dy^{3+}$ | 550 | 149 |
| 37 | $(Ca_{0.45}Sr_{0.45}Mg_{0.1})O \cdot 0.5SiO_2 \cdot 0.075MgF_2$: $0.15Eu^{2+}, 0.03Ce^{3+}$ | 592 | 121 |
| 38 | $(Ca_{0.45}Sr_{0.45}Zn_{0.1})O \cdot 0.5SiO_2 \cdot 0.06ZnF_2$: $0.08Eu^{2+}, 0.03Gd^{3+}$ | 596 | 114 |
| 39 | $(Ca_{0.45}Sr_{0.45}Zn_{0.1})O \cdot 0.5SiO_2 \cdot 0.02CaF_2$: $0.009Eu^{2+}, 0.008Bi^{3+}$ | 596 | 126 |
| 40 | $(Ca_{0.2}Sr_{0.8})O \cdot 0.5SiO_2 \cdot 0.055CaF_2$: $0.07Eu^{2+}, 0.03Y$ | 589 | 144 |
| 41 | $(Ba_{0.45}Sr_{0.45}Ca_{0.1})O \cdot 0.5SiO_2 \cdot 0.038CaF_2$: $0.06Eu^{2+}, 0.03La^{3+}$ | 588 | 132 |
| 42 | $(Sr_{0.8}Ba_{0.2})O \cdot 0.5SiO_2 \cdot 0.045SrF_2$: $0.06Eu^{2+}, 0.3Ce^{3+}, 0.2Dy^{3+}$ | 550 | 152 |
| 43 | $(Sr_{0.8}Ba_{0.2})O \cdot 0.5SiO_2 \cdot 0.07ZnF_2$: $0.08Eu^{2+}, 0.04Pr^{3+}, 0.3Tb^{3+}$ | 550 | 131 |
| 44 | $(Sr_{0.8}Ba_{0.2})O \cdot 0.5SiO_2 \cdot 0.015BaF_2$: $0.06Eu^{2+}, 0.09Bi^{3+}, 0.05Dy^{3+}$ | 550 | 141 |
| 45 | $(Sr_{0.8}Ba_{0.2})O \cdot 0.5SiO_2 \cdot 0.02CaCl_2$: $0.1Eu^{2+}, 0.1La^{3+}, 0.2Dy^{3+}$ | 550 | 171 |
| 46 | $(Sr_{0.8}Ba_{0.2})O \cdot 0.5SiO_2 \cdot 0.025SrF_2$: $0.06Eu^{2+}, 0.04Pr^{3+}, 0.3Tb^{3+}$ | 550 | 161 |
| 47 | $(Sr_{0.98}Mg_{0.02})O \cdot 0.5SiO_2 \cdot 0.04MgF_2$: $0.24Eu^{2+}, 0.4Y^{3+}, 0.3Tb^{3+}$ | 576 | 162 |
| 48 | $(Sr_{0.98}Zn_{0.02})O \cdot 0.5SiO_2 \cdot 0.045ZnF_2$: $0.25Eu^{2+}, 0.1La^{3+}, 0.09Gd^{3+}$ | 578 | 172 |
| 49 | $(Ba_{0.45}Sr_{0.45}Ca_{0.1})O \cdot 0.5SiO_2 \cdot 0.009MgF_2$: $0.4Eu^{2+}, 0.05Gd^{3+}, 0.08Dy^{3+}$ | 588 | 155 |
| 50 | $(Ba_{0.45}Sr_{0.45}Mg_{0.1})O \cdot 0.5SiO_2 \cdot 0.03MgF_2$: $0.2Eu^{2+}, 0.05Ce^{3+}, 0.4Tb^{3+}$ | 592 | 161 |

It can be seen from Table 1 that, from Example 1 to Example 50, the luminescence is obviously improved by co-doping with other ions.

Example 51

Production of a White Light Emitting Device

A white light emitting device can be obtained by incorporating the phosphor of Example 30 into a GaInN blue LED. The powder of the phosphor is firstly dispersed in resin, and then coated on a GaInN LED chip. After welding circuit and packaging, a white light emitting device is produced.

Example 52

Production of a White Light Emitting Device

A white light emitting device can be obtained by incorporating the phosphor of Example 1 into a GaInN blue LED. The powder of the phosphor is firstly dispersed in resin, and then coated on a GaInN LED chip. After welding circuit and packaging, a white light emitting device is produced. This device has lower color temperature comparing with the device of Embodiment 51.

Example 53

Production of a White Light Emitting Device

A white light emitting device can be obtained by incorporating the phosphors of Examples 13 and 19 with 3:2 ratio in weight into a GaInN blue LED. The powder of the phosphor is first dispersed in resin, and then coated on a GaInN LED chip. After welding circuit and packaging, a white light emitting device is produced. This device has higher color rendering index comparing with the device of Example 51.

Example 54

Production of a Green Light Emitting Device

A green light emitting device can be obtained by incorporating the phosphor of Example 14 into a UV LED. The powder of the phosphor is first dispersed in resin, and then coated on a UV LED chip. After welding circuit and packaging, a green light emitting device is produced.

Example 55

Production of an Orange Light Emitting Device

An orange light emitting device can be obtained by incorporating the phosphor of Example 19 into a UV LED. The powder of the phosphor is firstly dispersed in resin, and then coated on a UV LED chip. After welding circuit and packaging, an orange light emitting device is produced.

Example 56

Production of a White Light Emitting Device

A white light emitting device can be obtained by incorporating the phosphor of Example 14 and $BaMgAl_{10}O_{17}$:Eu blue phosphor and CaMoO$_4$:Eu red phosphor into a UV LED. The powder mixture of these phosphors are first dispersed in resin, and then coated on a UV LED chip. After welding circuit and packaging, a white light emitting device is produced.

INDUSTRIAL APPLICABILITY

The phosphor according to the present invention is readily produced and can be suitably used in light emitting devices, showing high emission intensity.

The invention claimed is:

1. A silicon-containing phosphor for a light emitting diode ("LED"), comprising:
a host material with a luminescent center represented by the general formula:

AO.$a$SiO$_2$.$b$AX$_2$:$m$Eu$^{2+}$,$n$R$^{3+}$ wherein A is at least one metal element selected from the group consisting of Sr, Ba, Ca, and Zn,
X is at least one halogen element selected from the group consisting of F, Cl, Br, and I,
R is Y,
0.1<$a$<2,
0.005<$b$≤0.02,
0.005<$m$<0.5,
0.005<$n$<0.5, and
$m$+$n$<1.

2. A method of producing the phosphor according to claim 1, comprising:
selecting raw materials from the corresponding elementary substance, oxide, halide or other compound of the compositional elements, and weighing the raw materials according to the stoichiometric ratio;
mixing and grinding the raw materials to form a mixture;
baking the mixture at high temperature in reducing atmosphere to form a baked product; and
carrying out a post-treatment to the baked product to obtain the phosphor.

3. The method according to claim 2, wherein the baking in reducing atmosphere is carried out once, twice or more.

4. The method according to claim 2, wherein the temperature of each baking is during 1100~1500° C.

5. The method according to claim 2, wherein each baking process should last for 0.5~20 h.

6. A light emitting device comprising:
at least one of UV, purple and blue light LED chip; and
the silicon-containing phosphor according to claim 1.

7. The light emitting device according to claim 6, further comprising more than one phosphor having different compositions.

8. The light emitting device according to claim 6, further comprising at least one additional phosphor selected from other types.

9. The light emitting device according to claim 6, wherein an emitting color of the light emitting device is green, yellow, orange or white.

10. A display, comprising the light emitting device according to claim 6 as a light source.

11. A lighting system, comprising the light emitting device according to claim 6 as a light source.

12. The phosphor according to claim 1, wherein the phosphor is a member of the group consisting of:
(Sr$_{0.8}$Ba$_{0.2}$) O.0.5SiO$_2$.0.01SrF$_2$:0.05Eu$^{2+}$, 0.02Y$^{3+}$
(Sr$_{0.8}$Ba$_{0.2}$) O.0.5SiO$_2$.0.009CaF$_2$:0.08Eu$^{2+}$, 0.02Y$^{3+}$
(Sr$_{0.55}$Ba$_{0.45}$) O.0.5SiO$_2$.0.01SrF$_2$:0.1 Eu$^{2+}$, 0.06Y$^{3+}$, and
(Sr$_{0.4}$Ba$_{0.6}$) O.1.9SiO$_2$.0.018CaI$_2$:0.06Eu$^{2+}$, 0.06Y$^{3+}$.

13. The method according to claim 2, wherein the phosphor is a member of the group consisting of
(Sr$_{0.8}$Ba$_{0.2}$) O.0.5SiO$_2$.0.01SrF$_2$:0.05Eu$^{2+}$, 0.02Y$^{3+}$
(Sr$_{0.8}$Ba$_{0.2}$) O.0.5SiO$_2$.0.009CaF$_2$:0.08Eu$^{2+}$, 0.02Y$^{3+}$
(Sr$_{0.55}$Ba$_{0.45}$) O.0.5SiO$_2$.0.01SrF$_2$:0.1Eu$^{2+}$, 0.06Y$^{3+}$, and
(Sr$_{0.4}$Ba$_{0.6}$) O.1.9SiO$_2$.0.018CaI$_2$:0.06Eu$^{2+}$, 0.06Y$^{3+}$.

14. The light emitting devise according to claim 6, wherein the phosphor is a member of the group consisting of:
(Sr$_{0.8}$Ba$_{0.2}$) O.0.5SiO$_2$.0.01SrF$_2$:0.05Eu$^{2+}$, 0.02Y$^{3+}$
(Sr$_{0.8}$Ba$_{0.2}$) O.0.5SiO$_2$.0.009CaF$_2$:0.08Eu$^{2+}$, 0.02Y$^{3+}$
(Sr$_{0.55}$Ba$_{0.45}$) O.0.5SiO$_2$.0.01SrF$_2$:0.1Eu$^{2+}$, 0.06Y$^{3+}$, and
(Sr$_{0.4}$Ba$_{0.6}$) O.1.9SiO$_2$.0.018CaI$_2$:0.06Eu$^{2+}$, 0.06Y$^{3+}$.

* * * * *

UNITED STATES PATENT AND TRADEMARK OFFICE
CERTIFICATE OF CORRECTION

PATENT NO. : 9,523,035 B2
APPLICATION NO. : 12/359693
DATED : December 20, 2016
INVENTOR(S) : Weidong Zhuang et al.

Page 1 of 1

It is certified that error appears in the above-identified patent and that said Letters Patent is hereby corrected as shown below:

In the Specification

Column 1, Line 13:
Delete "2006/0088926.6," and insert -- 200610088926.6, --, therefor.

In the Claims

Column 10, Line 33, Claim 14:
Delete "devise" and insert -- device --, therefor.

Signed and Sealed this
Fourth Day of April, 2017

Michelle K. Lee
*Director of the United States Patent and Trademark Office*